(12) United States Patent
Campbell et al.

(10) Patent No.: US 11,219,135 B2
(45) Date of Patent: Jan. 4, 2022

(54) IMPACT RESISTANT HINGE

(71) Applicant: Microsoft Technology Licensing, LLC, Redmond, WA (US)

(72) Inventors: Kent Allen Campbell, Issaquah, WA (US); Prasad Raghavendra, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/855,848

(22) Filed: Apr. 22, 2020

(65) Prior Publication Data

US 2021/0100118 A1 Apr. 1, 2021

Related U.S. Application Data

(60) Provisional application No. 62/908,987, filed on Oct. 1, 2019.

(51) Int. Cl.
*G06F 1/16* (2006.01)
*H05K 5/02* (2006.01)

(52) U.S. Cl.
CPC ......... *H05K 5/0226* (2013.01); *G06F 1/1616* (2013.01); *G06F 1/1656* (2013.01); *G06F 1/1681* (2013.01)

(58) Field of Classification Search
CPC .... G06F 1/1616; G06F 1/1618; G06F 1/1656; G06F 1/1681
See application file for complete search history.

(56) References Cited

U.S. PATENT DOCUMENTS

| | | | |
|---|---|---|---|
| 6,251,493 B1 * | 6/2001 | Johnson | F16F 1/37 428/220 |
| 6,831,229 B1 | 12/2004 | Maatta et al. | |
| 8,379,378 B2 | 2/2013 | Visser et al. | |
| 8,441,783 B2 * | 5/2013 | Tanaka | G06F 1/1616 361/679.09 |
| 8,699,212 B2 | 4/2014 | Galerne | |
| 8,867,200 B2 | 10/2014 | Suzuki et al. | |
| 9,625,950 B1 | 4/2017 | Moore et al. | |
| 10,364,598 B2 * | 7/2019 | Tazbaz | G06F 1/1681 |
| 10,469,635 B1 * | 11/2019 | Carlson | G06F 1/1616 |
| 10,656,685 B2 * | 5/2020 | Cheng | G06F 1/1681 |
| 10,831,245 B1 * | 11/2020 | Miyamoto | G06F 1/1618 |
| 10,838,458 B1 * | 11/2020 | Park | H04M 1/0268 |

(Continued)

FOREIGN PATENT DOCUMENTS

| | | |
|---|---|---|
| KR | 20050045213 A | 5/2005 |
| KR | 20050055191 A | 6/2005 |

OTHER PUBLICATIONS

"International Search Report and Written Opinion Issued in PCT Application No. PCT/US20/048069", dated Nov. 25, 2020, 14 Pages.

(Continued)

*Primary Examiner* — Anthony Q Edwards
(74) *Attorney, Agent, or Firm* — Ray Quinney & Nebeker P.C.; Paul N. Taylor (57) ABSTRACT

A computing device includes a first portion and a second portion rotatable relative to each other about a hinge. A bumper is located between the hinge and the first portion. The bumper includes an impact resistant material. The impact resistant material absorbs some or all of the force from an impact between a hinge body and the first portion.

20 Claims, 7 Drawing Sheets

(56) References Cited

U.S. PATENT DOCUMENTS

| | | | |
|---|---|---|---|
| 2006/0034043 A1* | 2/2006 | Hisano | G06F 1/1616 |
| | | | 361/679.04 |
| 2006/0071172 A1* | 4/2006 | Ertel | G01T 1/1644 |
| | | | 250/370.11 |
| 2006/0169906 A1* | 8/2006 | Bhatt | H01L 27/14658 |
| | | | 250/370.09 |
| 2007/0097014 A1* | 5/2007 | Solomon | G06F 1/1662 |
| | | | 345/1.1 |
| 2013/0016469 A1* | 1/2013 | Galerne | G06F 1/1656 |
| | | | 361/679.21 |
| 2015/0007416 A1* | 1/2015 | Chen | G06F 1/1681 |
| | | | 16/386 |
| 2018/0067520 A1* | 3/2018 | Maatta | G06F 1/1681 |
| 2019/0094917 A1* | 3/2019 | Schmelzle | E05D 5/14 |
| 2019/0146561 A1* | 5/2019 | Escamilla | G06F 1/1616 |
| | | | 361/679.27 |
| 2021/0089077 A1* | 3/2021 | Wang | G06F 1/203 |
| 2021/0109572 A1* | 4/2021 | Ou | H04M 1/0216 |

OTHER PUBLICATIONS

Villas-Boas, Antonio, "Samsung has supposedly fixed its foldable Galaxy Fold smartphone—here's what it changed". Retrieved from: https://www.businessinsider.in/tech/samsung-has-supposedly-fixed-its-foldable-galaxy-fold-smartphone-heres-what-it-changed/articleshow/71000925.cms, Sep. 6, 2019, 6 Pages.

\* cited by examiner

IMPACT RESISTANT HINGE

CROSS-REFERENCE TO RELATED APPLICATIONS

This application claims priority to and benefit of U.S. Provisional Patent Application No. 62/908,987, filed Oct. 1, 2019, which is hereby incorporated in its entirety.

BACKGROUND

Background and Relevant Art

Computing devices are used in nearly every aspect of society. Mobile computing devices are continuously reducing in size. As mobile computing devices get smaller, users often desire for reduced clearances and tolerances. Some mobile computing devices are foldable about one or more hinges. Reducing the clearances and/or tolerances of a hinge may result in elements of the computing device contacting each other, potentially damaging the computing device.

BRIEF SUMMARY

In some embodiments, a computing device includes a first portion (e.g., a display) and a second portion (e.g., a second display or keyboard). A hinge (e.g., a rotating and translating hinge) connects the first portion to the second portion. In some embodiments, bumpers (e.g., grommets) including an impact resistant member are affixed to the first and/or second portions near the hinge to absorb any impact between the portion(s) and the hinge. In some embodiments, one or more of the bumpers extends beyond a height of the corresponding portion so as to act as a foot for the device, such that the member, rather than the portion, contacts a resting surface. In some embodiments, a bumper is affixed to the hinge (e.g., in lieu of affixing a bumper to the first or section portion). In some embodiments, in an overextended position, the hinge is prevented from contacting the first or second portion by the corresponding bumper.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which.

DETAILED DESCRIPTION

Figure 1:
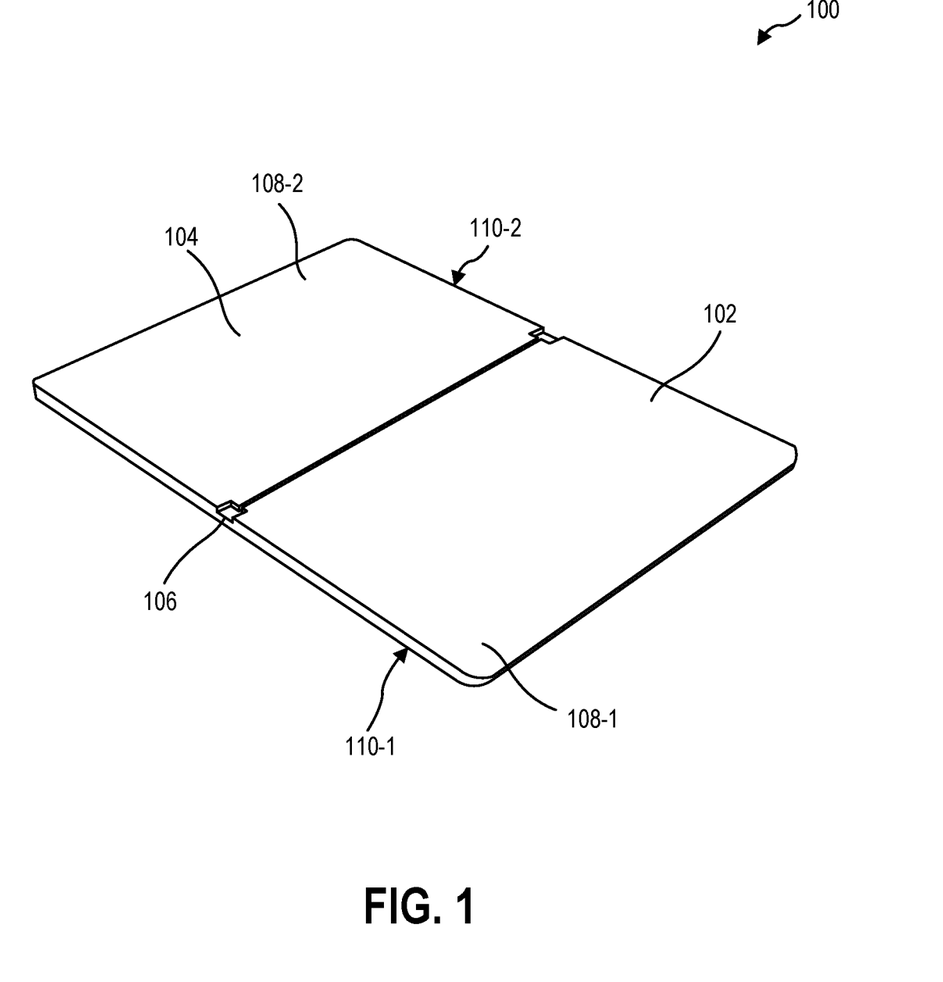
FIG. 1 is a representation of a perspective view of a computing device, according to at least one embodiment of the present disclosure.

This disclosure generally relates to devices, systems, and methods to protect fragile elements of a computing device. FIG. 1 is a perspective view of a representation of a computing device 100, according to at least one embodiment of the present disclosure. The computing device 100 includes a first portion 102 and a second portion 104. The first portion 102 is rotatable relative to the second portion 104 about at least one hinge 106. In the embodiment shown in FIG. 1, the first portion 102 rotates relative to the second portion 104 about two hinges 106. However, it should be understood that the computing device may include more or less hinges than two. For example, the computing device may include one, two, three, four, five, six, seven, eight, nine, ten, or more hinges. The number of hinges 106 may depend on various factors, such as the weight of the first portion 102, the weight of the second portion 104, the difference in weight between the first portion 102 and the second portion 104, the desired resistance to rotation, the length of the computing device 100, the width of the computing device 100, the thickness of the computing device 100, any other factor, and combinations thereof.

In some embodiments, the first portion 102 and/or the second portion 104 may include one or more of glass covers, plastic covers, displays, ceramic plates, aluminum plates, magnesium plates, any other plate, material, or cover, and combinations thereof. For the purposes of this disclosure, unless otherwise stated, a discussion of parts, elements, and relationships with respect to the first portion 102 may be applied in a similar fashion to the second portion 104 in addition to the first portion 102 or as an alternative to the first portion 102. The hinge 106 may be made from a steel alloy, aluminum, plastic, or other material.

In the embodiment shown, the hinges 106 both rotate and translate relative to the first portion 102 and the second portion 104. A rotating and a translating hinge may facilitate an increased range of motion between the first portion 102 and the second portion 104. For example, the first portion 102 includes a first top side 108-1 and a first bottom side 110-1, and the second portion 104 includes a second top side 108-2 and a second bottom side 110-2. In a first closed position, the first bottom side 110-1 may be in close proximity with (e.g., parallel), and optionally in contact with, the second bottom side 110-2, and in a second closed position the first top side 108-1 may be in close proximity with (and optionally contact) the second top side 108-2.

In some embodiments, the first portion 102 and/or the second portion 104 may be more fragile and/or brittle than the hinge 106. Thus, if the hinge 106 contacts and/or bumps the first portion 102 or the second portion 104, the portion may break, crack, or deform. This may reduce functionality of the computing device 100 by interfering with the view of a display, interfering with the sensitivity of a touch screen display, causing the first portion to separate from the hinge, cause some other reduction in functionality, and combinations of the foregoing. Furthermore, a broken or cracked first portion may be aesthetically unappealing or even dangerous to the user.

Figure 2:
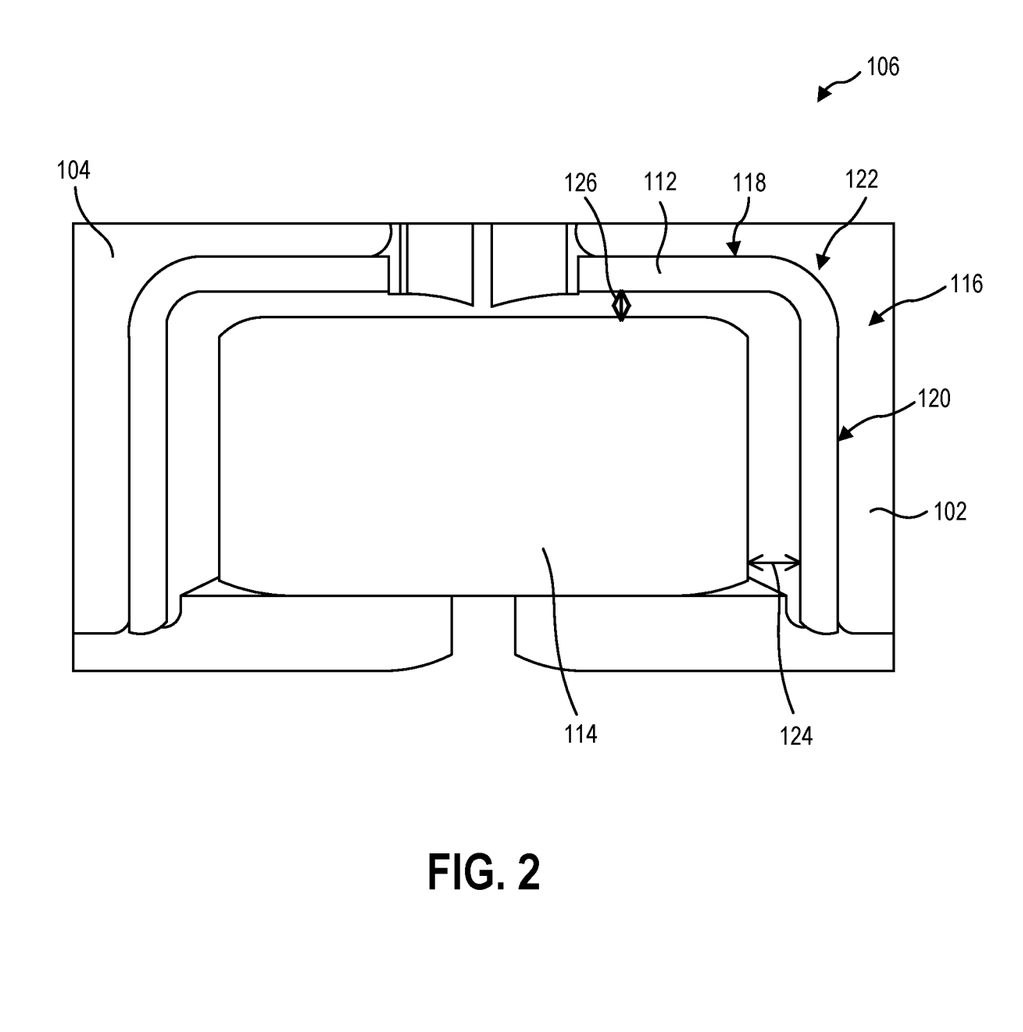
FIG. 2 is a top down view of a hinge of the computing device of FIG. 1.

FIG. 2 is a top-down view of the hinge 106 of FIG. 1 in an open position. The hinge 106 connects the first portion 102 to the second portion 104. A bumper 112 (e.g., a grommet) is located between the first portion 102 and the body 114 of the hinge 106. The bumper 112 may be made from an impact resistant material (e.g., rubber or silicone). Thus, if the body 114 of the hinge 106 contacts the bumper 112 (e.g., by an overextension of the hinge 106), the bumper 112 will absorb some or all of the energy from the impact. This may help to protect the relatively more fragile material of the first portion 102 from being damaged.

The first portion 102 includes a profile 116 of the first portion 102. The profile 116 is a cut-out in the first-portion 102 to make room for the hinge body 114. In the embodiment shown, the profile 116 includes a length section 118, a width section 120, and a curved section 122. The length section 118 is straight and parallel to a length of the body 114. The width section 120 is straight and parallel to a width of the body 114. The curved section 122 is curved and located between the length section 118 and the width section 120. In other embodiments, the profile 116 may be a different shape, e.g., the cut-out may have a corner with no curved section 122, or may be curved with no straight sections.

The bumper 102 is located away from the body 114 of the hinge 106 with a rotational offset 124 and a width offset 126. The rotational offset 124 provides room for the first portion 102 and the body 114 to rotate relative to each other. Furthermore, the rotational offset 124 is sufficient that the hinge does not damage the first portion 102 and/or contact the bumper 112 when the hinge 106 is closed. In some embodiments, the rotational offset 124 may be in a range having an upper value, a lower value, or upper and lower values including any of 0.1 mm, 0.2 mm, 0.3 mm. 0.4 mm, 0.5 mm, 0.6 mm, 0.7 mm, 0.8 mm, 0.9 mm, 1.0 mm, 1.1 mm, 1.2 mm, 1.3 mm, 1.4 mm, 1.5 mm, or any value therebetween. For example, the rotational offset 124 may be greater than 0.1 mm. In another example, the rotational offset 124 may be less than 1.5 mm. In yet other examples, the rotational offset 124 may be any value in a range between 0.1 and 1.5 mm. In some embodiments, it may be critical that the rotational offset 124 is less than 1.0 mm to improve the aesthetics of the computing device. In some embodiments, the rotational offset 124 may be less than 0.1 mm or greater than 1.5 mm.

The width offset 126 is the distance from the body 114 to the bumper 112 perpendicular to the axis of rotation of the hinge 106. The width offset 126 may be sized to allow the body 114 and the first portion 102 to rotate relative to each other without the body 114 rubbing against the first portion 102. In some embodiments, the width offset 126 may be in a range having an upper value, a lower value, or upper and lower values including any of 0.1 mm, 0.2 mm, 0.3 mm. 0.4 mm, 0.5 mm, 0.6 mm, 0.7 mm, 0.8 mm, 0.9 mm, 1.0 mm, 1.1 mm, 1.2 mm, 1.3 mm, 1.4 mm, 1.5 mm, or any value therebetween. For example, the width offset 126 may be greater than 0.1 mm. In another example, the width offset 126 may be less than 1.5 mm. In yet other examples, the width offset 126 may be any value in a range between 0.1 and 1.5 mm. In some embodiments, it may be critical that the width offset 126 is less than 1.0 mm to improve the aesthetics of the computing device. In some embodiments, the width offset 126 may be less than 0.1 mm or greater than 1.5 mm.

Reducing the offsets 124 and 126 allows for increased area for the corresponding portions (e.g., additional screen size if the portion is a display portion). Additionally, it may be aesthetically pleasing to reduce rotational offset 124 and the width offset 126 as much as possible. The rotational offset 124 and the width offset are therefore sized to accommodate normal, everyday use without contacting and/or damaging the first portion 102. However, during use, the computing device may be dropped, bumped, jostled, or otherwise subject to a sudden force. This may cause relative movement of the first portion 102 and the hinge body 114. If the movement is great enough, then the body 114 may move sufficient to contact the first portion 102, potentially causing the first portion 102 to crack, deform, and/or break.

Conventionally, to prevent damage, the rotational offset 124 and/or the width offset 126 is increased. This may reduce the functionality and/or aesthetic appeal of a computing device. By placing the bumper 112 between the first portion 102 and the body 114, the rotational offset 124 and the width offset 126 may be reduced, with the bumper 112 absorbing at least some of the impact from a sudden force. This helps to protect the first portion 102 from cracking and/or breaking.

Furthermore, by placing the bumper 112 between the first portion 102 and the body 114, the first portion 102 may be further offset from the body 114. This may increase the radius of curvature of the curved portion 122. Increasing the radius of curvature of the curved portion may reduce the stress concentrations at the curved portion 112, thereby further protecting the first portion 102 from cracking and/or breaking. In some embodiments, the radius of curvature may be in a range having an upper value, a lower value, or upper and lower values including any of 0.1 mm, 0.2 mm, 0.3 mm. 0.4 mm, 0.5 mm, 0.6 mm, 0.7 mm, 0.8 mm, 0.9 mm, 1.0 mm, 1.1 mm, 1.2 mm, 1.3 mm, 1.4 mm, 1.5 mm, or any value therebetween. For example, the radius of curvature may be greater than 0.1 mm. In another example, the radius of curvature may be less than 1.5 mm. In yet other examples, the radius of curvature may be any value in a range between 0.1 mm and 1.5 mm. In some embodiments, it may be critical that the radius of curvature is greater than 0.5 mm to reduce the stress concentrations and protect the first portion 102. In some embodiments, the radius of curvature may be less than 0.1 mm or greater than 1.5 mm.

Figure 3:
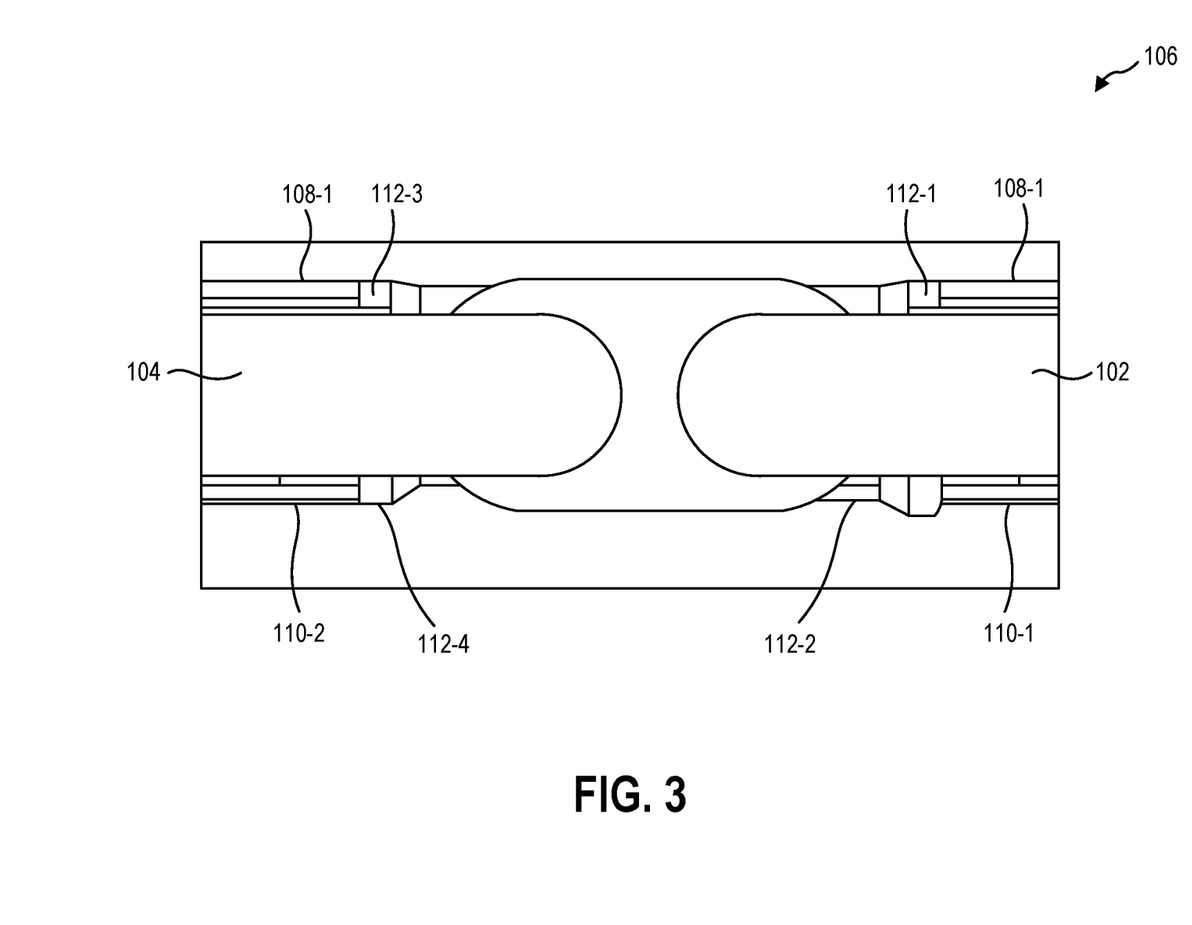
FIG. 3 is a side view of the hinge of the computing device of FIG. 1 and FIG. 2.

FIG. 3 is a side view of the hinge 106 of FIG. 1. As may be seen, the first portion 102 includes a first bumper 112-1 connected to a first upper surface 108-1 and a second bumper 112-2 connected to a first lower surface 110-1. Similarly, the second portion 104 includes a third bumper 112-3 connected to a second upper surface 108-2 and a fourth bumper 112-4 connected to a second lower surface 110-2. Thus, the first portion 102 and the second portion 104 may have a bumper between them and the hinge body 114 for all directions of rotation. This helps to protect the first portion 102 and/or the second portion 104 from damage regardless of the position the computing device is in when it is dropped. Moreover, the bumpers may also protect the hinge from deforming or breaking by cushioning the impact between the hinge and the relatively non-deformable portions 102 and 104. In some embodiments, each bumper has the same dimensions as each other bumper. In some embodiments, at least one bumper has a distinct shape and/or size as compared to other bumpers. In some embodiments, a subset of the bumpers is sized to act as feet for the device (e.g., to extend beyond a surface of the corresponding portion). Although FIG. 3 shows the bumpers 112 adhered to the portions 102 and 104, in other embodiments, one or more of the bumpers are instead adhered to the hinge body 114.

Figure 4:
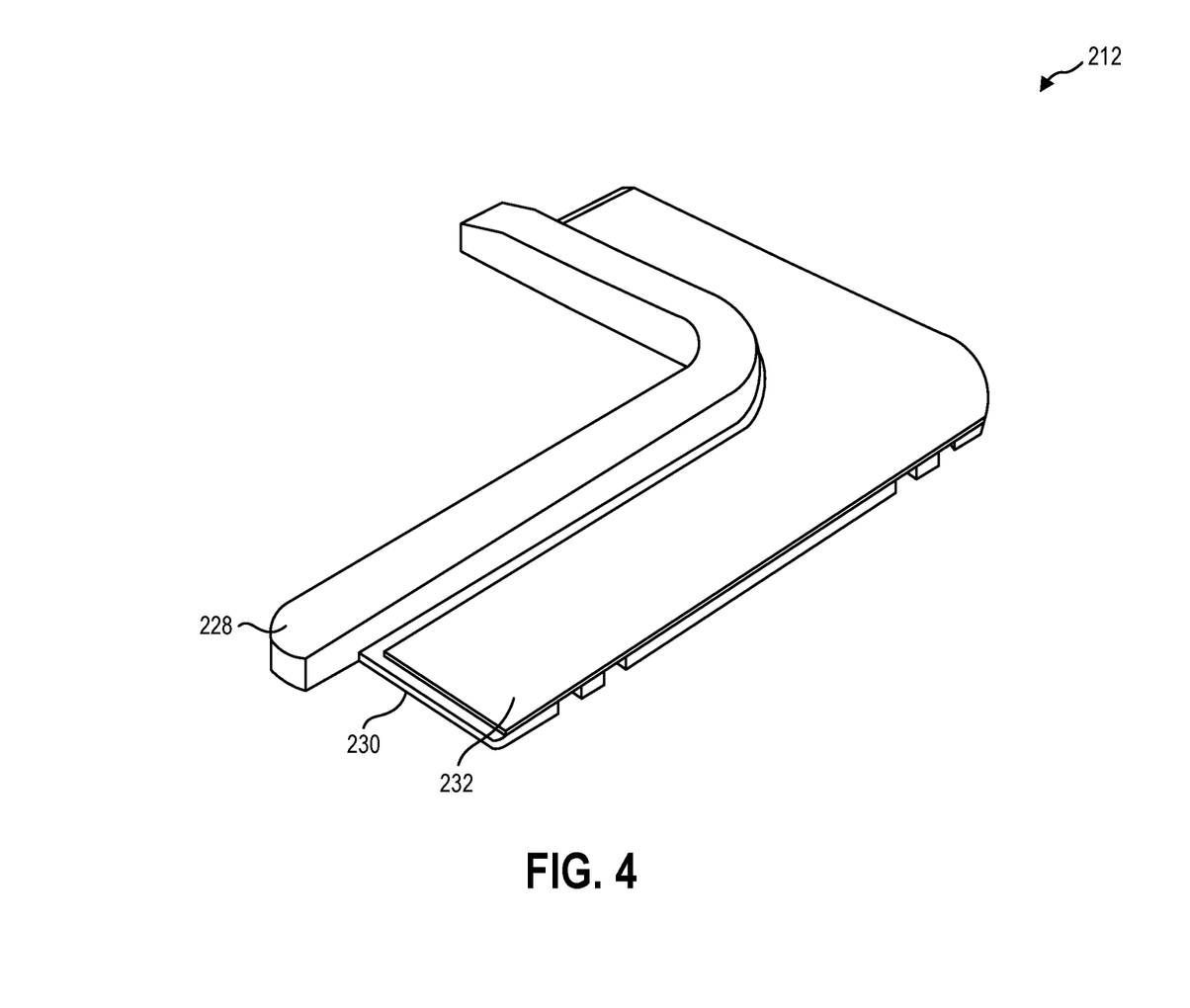
FIG. 4 is a perspective view of a bumper assembly, according to at least one embodiment of the present disclosure.

FIG. 4 is a representation of a bumper assembly 212, according to at least one embodiment of the present disclosure. The bumper assembly 212 includes an impact resistant material 228 (e.g., a deformable material such as rubber). The impact resistant material 228 is bonded to a connecting member 230. The connecting member 230 is sized and configured to extend underneath a corresponding surface (e.g., the first upper surface 108-1 or the first lower surface 110-1 of FIG. 1) of the first or second portion to connect the impact resistant material 228 to the portion. The connecting member 230 may be adhered to the first portion using an adhesive layer 232. Connecting the impact resistant material 228 to the first portion using a connecting member 230 may help to increase the strength of the connection, thereby working to prevent the impact resistant material from breaking or tearing away.

Figure 5:
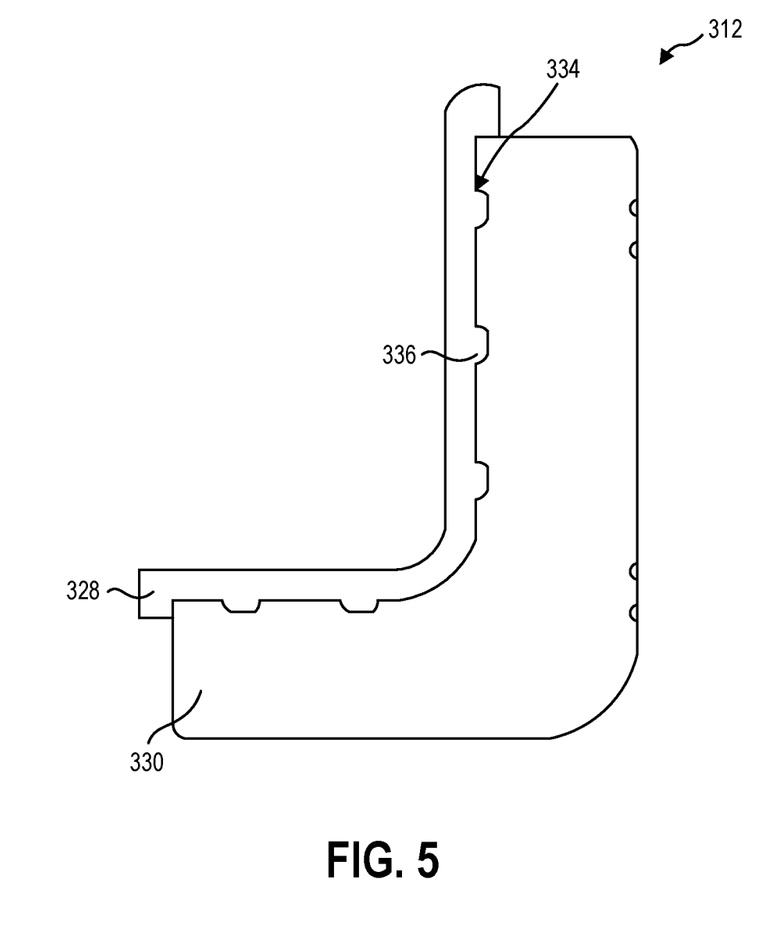
FIG. 5 is a bottom view of a bumper assembly, according to at least one embodiment of the present disclosure.

FIG. 5 is a bottom view of a bumper assembly 312, according to at least one embodiment of the present disclosure. The connecting member 330 has a connecting profile 334 that runs along the side of the connecting member 330 to which the impact resistant material 328 is connected. The connecting profile 334 includes one or more features 336. The features 336 may be cut-outs or protrusions in the connecting profile 334 that strengthen the mechanical strength of the connection between the impact resistant material 328 and the connecting member 330. In some embodiments, the features 336 may include surface features, such as knurling, cross-hatching, and other surface features.

Figure 6:
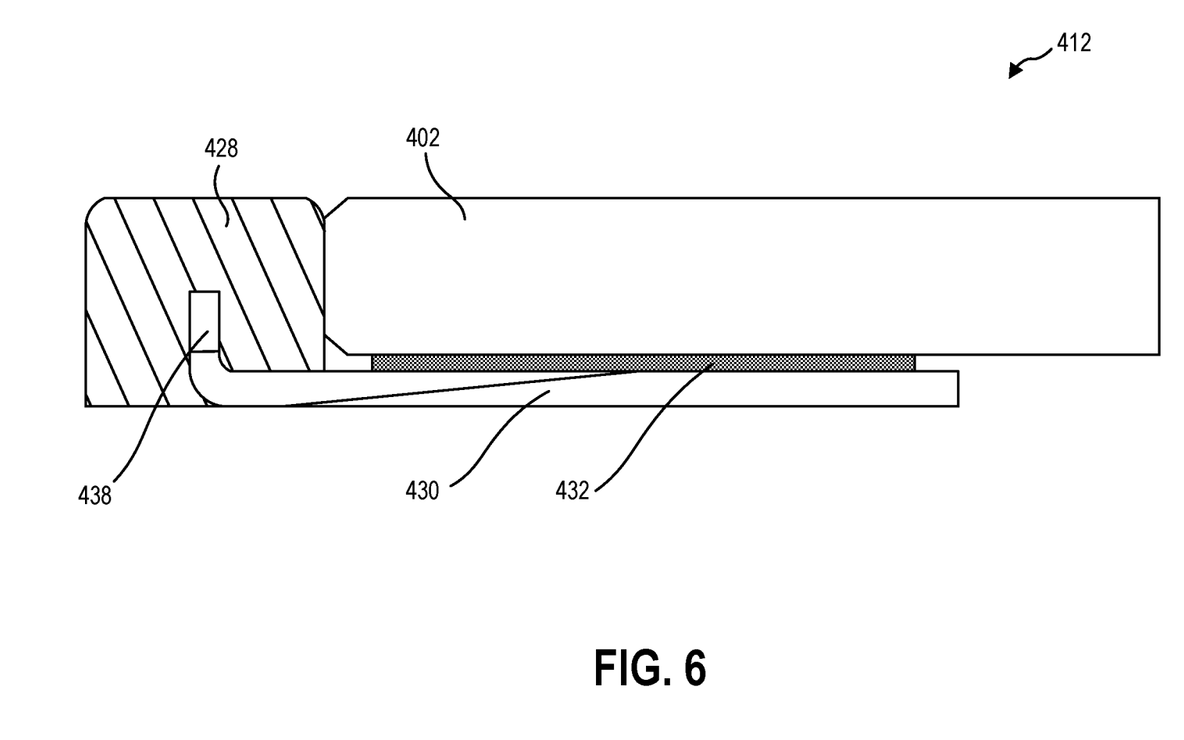
FIG. 6 is a cross-sectional view of a bumper assembly, according to at least one embodiment of the present disclosure.

FIG. 6 is a representation of a cross sectional view of a bumper assembly 412, according to at least one embodiment of the present disclosure. In the embodiment shown, the connecting member 430 includes a lip 438. The lip 438 is a bend in the connecting member 438 that increases the mechanical strength of the connection between the impact resistant material 428 and the connecting member 430. As may be seen in FIG. 6, the impact resistant material 428 is molded to the connecting member 430. For example, the impact resistant material 428 may be overmolded (such as through injection molding or another process) over the connecting member 430. This may allow the impact resistant material 428 to match to contours of the connecting member 430.

As may also be seen in FIG. 6, the impact resistant material 428 is secured to the first portion 402 through the connecting member 430. The connecting member 430 is secured to the first portion 402 using an adhesive layer 432. In the embodiment shown, the impact resistant material 428 is contacting the first portion 402. In some embodiments, the impact resistant material may be adhered to the first portion 402.

Figure 7:
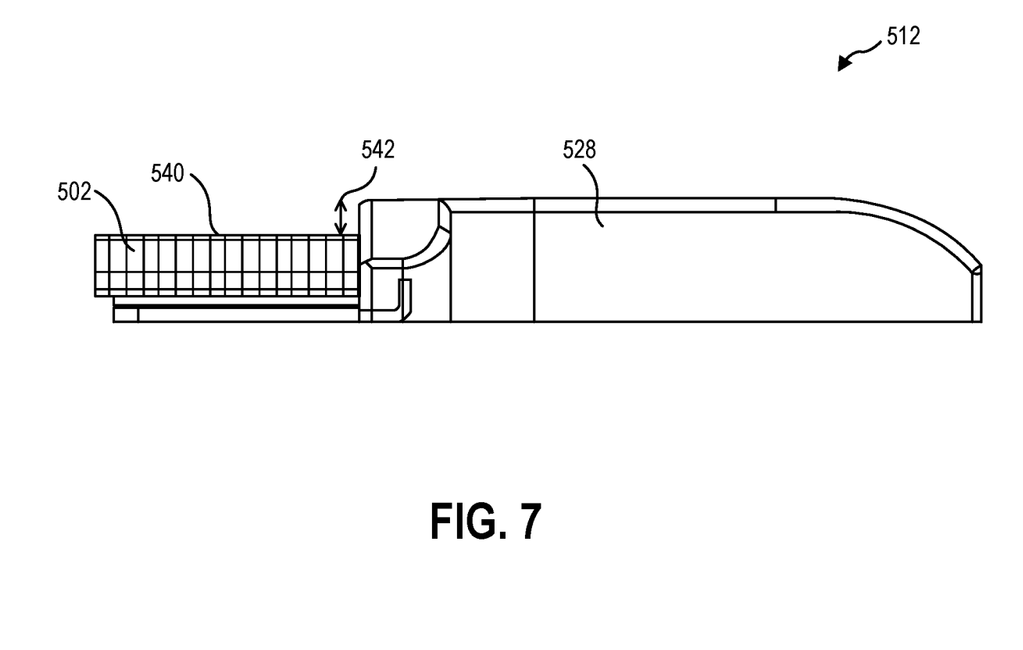
FIG. 7 is a side view of another bumper assembly, according to at least one embodiment of the present disclosure.

FIG. 7 is a representation of a side view bumper assembly 512, according to at least one embodiment of the present disclosure. In the embodiment shown, the impact resistant material 528 (e.g., bumper 112) extends beyond the surface 540 of the portion 502 (e.g., the first portion 102 or the second portion 104). In some embodiments, a first subset of the bumpers 112 are sized to extend beyond the corresponding portion surfaces while a second subset of the bumpers are sized to not extend (e.g., be flush with) the corresponding portion surfaces. For example, the bumpers that would contact a resting surface when the device is oriented in a laptop mode would be sized to extend beyond the corresponding surface, while the other bumpers would be not extend beyond their corresponding portion surfaces.

Having the material 528 extend beyond the surface of the portion 502 may further help to protect the portion 502 from cracking, scratching, deforming, and/or breaking. Furthermore, this provides the portion 502 with a "foot," or a support on which the computing device may rest when placed down on a support surface so that the surface 540 does not contact the support surface. This may help to prevent the surface 540 from being scratched, cracked, or broken. In addition, the bumper 112 is optionally adapted (e.g., textured and/or sized) to provide a desired coefficient of friction (CoF) between the device and a resting surface. In this way, the bumper 112 helps prevent the device from sliding during use and/or when the user is attempting to open the device.

The impact resistant material 528 extends an extension height 542 beyond the surface 540. In some embodiments, the extension height 542 may be in a range having an upper value, a lower value, or upper and lower values including any of 0.05 mm, 0.1 mm, 0.15 mm, 0.20 mm, 0.25 mm, 0.30 mm, 0.35 mm, 0.40 mm, 0.50 mm, 0.60 mm, 0.70 mm, 0.80 mm, 0.90 mm, 1.00 mm, or any value therebetween. For example, the extension height 542 may be greater than 0.05 mm. In another example, the extension height 542 may be less than 1.00 mm. In yet other examples, the extension height 542 may be any value in a range between 0.05 mm and 1.0 mm. In some embodiments, it may be critical that the extension height 542 is greater than 0.30 mm to provide protection for the surface 540 of the first portion 502. In some embodiments, the impact resistant material 528 is sized such that the extension height is greater than a deformation factor for the material so that the corresponding portion does not contact the resting surface even when a user is operating the device and providing a downward force on the device (e.g., due to the user resting their hands the device). In some embodiments, the extension height may be 0, negative, or greater than 1.0 mm.

INDUSTRIAL APPLICABILITY

This disclosure generally relates to devices, systems, and methods to protect elements of a computing device. A computing device may include a first portion and a second portion that are connected by one or more hinges. For example, the first portion and the second portion may include one or more of glass covers, plastic covers, displays, ceramic plates, aluminum plates, magnesium plates, or any other plate, material, or cover. In some embodiments, the hinge may be made from a steel alloy, aluminum, plastic, or other material. For the purposes of this discussion, unless otherwise stated, a discussion of parts, elements, and relationships with respect to the first portion may be applied in a similar fashion to the second portion in addition to the first portion or as an alternative to the first portion.

The one or more hinges may facilitate relative rotation between the first portion and the second portion. In some embodiments, the one or more hinges may both rotate and translate relative to the first portion and/or the second portion. A rotating and a translating hinge may facilitate an increased range of motion between the first portion and the second portion. For example, the first portion may include a first top side and a first bottom side, and the second portion may include a second top side and a second bottom side. In a first position, the first bottom side may be parallel (and even contact) the second bottom side, and in a second position the first top side may be parallel (and even contact) the second top side.

In some embodiments, the first portion may be more brittle than the hinge. Thus, if the hinge contacts and/or bumps the first portion, the first portion may break or crack. This may reduce functionality of a device by interfering with the view of a display, interfering with the sensitivity of a touch screen display, causing the first portion to separate from the hinge, cause some other reduction in functionality, and combinations of the foregoing. Furthermore, a broken or cracked first portion may be aesthetically unappealing to the user.

In some embodiments, the first portion may have a greater compressive strength than the hinge, which may cause the hinge to bend, crack, or break upon contact with the first portion. This may cause the hinge to malfunction and/or be aesthetically unappealing to the user. In some embodiments, the first portion and/or the second portion may be both more brittle and have a harder compressive strength than the hinge. In this manner, a contact between the first portion and the hinge may damage, crack, break, or bend both the first portion and the hinge.

In some embodiments, an impact resistant member may be affixed to the first portion. The impact resistant member may contact the hinge before the hinge contacts the first portion. The impact resistant member may be made from a material that is more resilient and/or have a greater elastic deformity than one or both of the first portion and the hinge. Thus, when the hinge would normally contact the first portion during rotation of the first portion, the hinge may contact the impact resistant layer. Because the impact resistant member has a greater resilience and/or elastic deformity, the impact resistant member may not break upon contact with the hinge. Thus, the impact resistant member may absorb the force of the impact from the hinge, thereby at least partially protecting (e.g., reducing the damage to) both the first portion and the hinge.

In some embodiments, the impact resistant member may be fabricated from a material that has a lower compressive strength than both the first portion and the hinge. For example, the impact resistant member may be fabricated from, rubber, silicone, plastic, TPE, any other material, and combinations thereof.

In some embodiments, the impact resistant member may be attached to a connecting member, and the connecting member may be attached to the first portion. For example, the connecting member may be a hard plate that is adhered to the second side of the first portion with an adhesive layer. The metal plate may extend past an edge of the first portion. The impact resistant member may then be connected to the connecting member.

In some embodiments, the impact resistant member may be overmolded onto the connecting member. In some embodiments, a chemical primer may attached to the connecting member, and the chemical primer may further bond the impact resistant member to the connecting member. Thus, in some embodiments, the impact resistant member and the connecting member may become a single piece. In other words, the impact resistant member may not be removed from the connecting member without damaging or destroying the impact resistant member and/or the connecting member.

In some embodiments, the connecting member may include mechanical interlock features, such as texturing, braiding, profiles, cross-hatching, knurling, other mechanical interlock features, and combinations of the foregoing. In some embodiments, the connecting member may include an edge having an edge profile, the edge profile being non-straight. These mechanical interlock features may increase the strength of the bond between the impact resistant member and the connecting member. In some embodiments, the connecting member may include a lip in the hinge area around which the impact resistant member is attached or molded. This lip may increase the strength of the impact resistant member and the resistance of the impact resistant member to damage and deformation from impact by the hinge.

In some embodiments, the impact resistant member may be attached directly to the first portion. For example, the impact resistant member may be glued or molded onto the first portion. In some embodiments, the first portion may include mechanical interlock features, such as texturing, braiding, profiles, cross-hatching, knurling, other mechanical interlock features, and combinations of the foregoing. In some embodiments, the mechanical interlock features may be included in the first portion during manufacturing. In some embodiments, the mechanical interlock features may be included in the first portion post manufacturing, such as by grinding, milling, laser etching, other methods, and combinations thereof.

In some embodiments, the impact resistant member may be connected directly to the hinge. For example, the impact resistant member may be overmolded onto, or adhered to, an outer circumference of the hinge. In some embodiments, it may be aesthetically preferable to attach the impact resistant member directly to the hinge.

In some embodiments, the impact resistant member may be installed flush with a the first surface of the first portion. In some embodiments, the impact resistant member may extend proud above a height of the first portion. In other words, the impact resistant member may extend beyond the first surface of the first portion. In this manner, the impact resistant member may resemble a foot against which the mobile device may rest. This may help to protect the first portion from scratches, cracks, breaks, and other damage caused by a user placing the mobile device on a surface.

In some embodiments, the extension past the first surface may be in a range having an upper value, a lower value, or upper and lower values including any of 0.05 mm, 0.1 mm, 0.15 mm, 0.20 mm, 0.25 mm, 0.30 mm, 0.35 mm, 0.40 mm, 0.50 mm, 0.60 mm, 0.70 mm, 0.80 mm, 0.90 mm, 1.00 mm, or any value therebetween. For example, the extension may be greater than 0.05 mm. In another example, the extension may be less than 1.0 mm. In yet other examples, the extension may be any value in a range between 0.05 mm and 1.0 mm. In some embodiments, it may be critical that the extension is greater than 0.30 mm to properly protect the first surface. In some embodiments, the extension may be 0, negative, or greater than 1.0 mm.

The first portion has a hinge profile, which is the profile of the first portion around the hinge. To prevent the hinge from contacting the first portion during normal operation or when a user drops the computing device, the profile is offset from the range of motion of the hinge with a profile offset. In some embodiments, the impact resistant member may be placed inside the profile offset. In this manner, the impact resistant member may extend from the profile of the first portion to the range of motion of the hinge. This may reduce the visible or spatial gap between the first portion and the hinge, which may be visually appealing to the user.

The profile includes at least one corner having a first portion radius of curvature. In some embodiments, the first portion radius of curvature of the profile may be increased by offsetting the profile from the hinge. This may reduce the stress concentrations on the first portion. This may reduce the likelihood that the first portion may break or crack at the corner. In some embodiments, the first portion radius of curvature may be greater than 0 mm. For example, the radius of curvature may be greater than 0.1 mm, 0.2 mm, 0.3 mm, 0.4 mm, 0.5 mm, 0.6 mm, 0.7 mm, 0.8 mm, 0.9 mm, 1.0 mm, or any value therebetween. In some embodiments, it may be critical that the first portion radius of curvature is greater than 0.5 mm to reduce the likelihood of the first portion cracking.

In some embodiments, the impact resistant may follow the profile of the first portion. The impact resistant member may thus have an impact resistant member radius of curvature that is less than the first portion radius of curvature. In some embodiments, the impact radius of curvature may be approximately 0. In other words, the impact resistant member may make one or more sharp turns.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A computing device, comprising:
   a first portion including a first cover, the first cover having an inner surface and an outer surface, the outer surface being opposite the inner surface;
   a second portion;
   a rotating and translating hinge connecting the first portion to the second portion; and
   an impact resistant member affixed to the first portion, the impact resistant member extending above the outer surface of the first cover of the first portion.

2. The computing device of claim 1, further comprising a connecting member adhered to the inner surface of the first portion.

3. The computing device of claim 2, the impact resistant member being secured to the connecting member.

4. The computing device of claim 3, the impact resistant member being secured to the connecting member with a chemical connection.

5. The computing device of claim 2, the connecting member being adhered to the inner surface with an adhesive.

6. The computing device of claim 1, wherein impact resistant member is located between the rotating and translating hinge and the first portion such that the rotating and translating hinge contacts the impact resistant member in an impact configuration.

7. The computing device of claim 1, wherein the rotating and translating hinge includes a plurality of rotating and translating hinges connecting the first portion to the second portion.

8. The computing device of claim 7, wherein the impact resistant member includes a plurality of impact resistant members, and an individual impact resistant member of the plurality of impact resistant members is located between an individual impact resistant member and the first portion.

9. The computing device of claim 1, wherein the impact resistant member extends an extension height of at least 0.3 mm above the first portion.

10. The computing device of claim 1, wherein the first portion includes a profile having a corner with a first portion radius of curvature, and wherein the impact resistant member follows the profile of the first portion, the impact resistant member having an impact resistant member radius of curvature that is zero, and wherein the first portion radius of curvature is greater than 0.5 mm.

11. The computing device of claim 1, wherein the impact resistant member is a first impact resistant member, and further comprising a second impact resistant member, and wherein the second impact resistant member is connected to the second portion and extends above a second height of the second portion.

12. The computing device of claim 1, wherein the first cover is glass.

13. A computing device, comprising:
a first portion and a second portion, the first portion including a first cover, the first cover having an inner surface and an outer surface, the outer surface being opposite the inner surface;
a rotating and translating hinge connecting the first portion to the second portion; and
an impact resistant member affixed to the rotating and translating hinge, the impact resistant member extending above a height of the first cover of the first portion in a closed configuration.

14. The computing device of claim 13, wherein the impact resistant member extends above a second height of the second portion in the closed configuration.

15. The computing device of claim 13, wherein the impact resistant member is formed of a material that is more elastically deformable than the rotating and translating hinge.

16. The computing device of claim 13, wherein the first portion is more brittle than the rotating and translating hinge.

17. The computing device of claim 13, wherein the first portion has a first compressive strength that is at least 50 GPa less than a hinge compressive strength of the rotating and translating hinge.

18. The computing device of claim 13, wherein the first portion has a Mohs hardness that is greater than that of the rotating and translating hinge.

19. The computing device of claim 13, wherein the first cover is glass.

20. A computing device, comprising:
a first portion and a second portion, the first portion including a first cover, the first cover having an inner surface and an outer surface, the outer surface being opposite the inner surface;
an impact resistant member affixed to the first portion, wherein the impact resistant member extends above an outer surface of the first cover of the first portion;
a rotating and translating hinge connecting the first portion to the second portion, wherein, in an overextended position, the rotating and translating hinge is prevented from contacting the first portion by the impact resistant member.

* * * * *